VOLTAGE REGULATING SEMICONDUCTOR DEVICE

Filed May 8, 1959 3 Sheets-Sheet 1

G. SMOOT HORSLEY
WILLIAM SHOCKLEY
INVENTORS

BY Flehr and Swain
ATTORNEYS

VOLTAGE REGULATING SEMICONDUCTOR DEVICE

Filed May 8, 1959 3 Sheets-Sheet 2

G. SMOOT HORSLEY
WILLIAM SHOCKLEY
INVENTOR.

BY Flehr and Swain
ATTORNEYS

July 7, 1964 W. SHOCKLEY ET AL 3,140,438

VOLTAGE REGULATING SEMICONDUCTOR DEVICE

Filed May 8, 1959 3 Sheets-Sheet 3

G. SMOOT HORSLEY
WILLIAM SHOCKLEY
INVENTOR.

BY [signature]

ATTORNEYS

United States Patent Office 3,140,438
Patented July 7, 1964

3,140,438

VOLTAGE REGULATING SEMICONDUCTOR DEVICE

William Shockley, Los Altos, and George Smoot Horsley, Mountain View, Calif., assignors, by direct and mesne assignments, to Clevite Corporation, Cleveland, Ohio, a corporation of Ohio Filed May 8, 1959, Ser. No. 811,838
8 Claims. (Cl. 323—22)

This invention relates generally to a semiconductive device and more particularly to a voltage limiting and voltage regulating semiconductive device.

Voltage limiting and voltage regulating semiconductive devices (diodes) containing p-n junctions are valuable and frequently used circuit elements. The basic principle employed in this class of semiconductive devices is the voltage limiting action of a p-n junction. P-n junctions have a current voltage characteristic which has a very rapidly increasing current when a certain threshold (breakdown) voltage is reached (see U.S. Patent No. 2,714,702, W. Shockley, issued August 2, 1955). This increase is so rapid that the voltage is substantially independent of current over a wide range of current.

There are a number of problems associated with making voltage reference and limiting semiconductive devices. Semiconductive diodes of the prior art are sensitive to surface conditions, have undesirably large noise, and are relatively expensive and difficult to make when a high degree of temperature compensation is desired.

The surface sensitivity arises from the fact that the electric field near the surface of a p-n junction is controlled by the surface conditions. Because of the surface conditions, the electric field at a given voltage is higher near the surface than in the interior. Breakdown occurs preponderantly at the surface, and small changes in surface conditions alter breakdown voltage.

Flow of current at the surface has another undesirable effect. The diode exhibits a high dynamic impedance. When the voltage limiting condition is reached, further increases in current produce only a small voltage drop across the junction where avalanche multiplication (breakdown) is occurring. These currents also produce ohmic voltage drops in the associated material forming the diode. If the current paths are restricted to a small portion of the cross-sectional area of the diode, as is the case when breakdown occurs near the surface, then the current paths are restricted to a small region of the diode and higher series resistance results.

A low dynamic impedance is desirable for circuits having feedback loops in which current varies through the device. If the device shows a finite resistance, then changes in the current through the device cause changes in the voltage across it. The device does not regulate the voltage ideally. Undesirable effects may result in circuits in which the load current is highly variable. Thus a low or vanishing dynamic impedance is highly desirable.

As mentioned above, noise is generally undesirably high. The mechanism for the generation of noise in a diode is thought to be as follows: a spontaneous current is generated by the recombination centers in the space charge region of the p-n junction. The energy for generating this current is heat energy in the device. This and other aspects of currents in p-n junctions is discussed in Carrier Generation and Recombination in p-n Junctions, Sah, Noyce, and Shockley, Proceedings of IRE, vol. 45, page 1228, September 1957. Holes or electrons generated in the space charge region produce secondaries by avalanche multiplication in the p-n junction. Under operating conditions, the multiplication of this current may be more than a thousand fold on the average. This implies that a condition verging on instability exists. Since the multiplication processes depend upon the electric field present, and the electric fields depend upon the space charge in the p-n junction, it is possible for the charge density of holes and electrons to so disturb the field as to produce local instabilities or negative resistance. It is thought that these same negative resistance effects, or effects like them, may well occur in voltage regulating p-n junctions with the result that the current is carried in small pulses or bursts of current typically of the order of 100 microamperes and lasting for a time of the order of one microsecond.

As a result, the current is quite noisy. Typical p-n junctions for voltage regulating and limiting generate noise of the order of a few millivolts up to tens of millivolts when passing currents of the order of microamperes up to ten milliamperes or more. As with many statistical effects, the variation tends to decrease as the number of events increases, and this is true for voltage regulator diodes. The noise tends to decrease with increasing current.

In the prior art, temperature compensation is generally achieved in one of two ways. One is to utilize a p-n junction whose breakdown or limiting voltage lies intermediate between the range at which the Zener effect and the avalanche effect occur. These effects have different temperature coefficients and over a small range of breakdown voltage they compensate to give a low or vanishing temperature coefficient. This type of compensation can, however, be achieved only over a limited range of voltages.

Another means of achieving temperature compensation is putting in series with a breakdown junction one or more p-n junctions biased in the forward direction. A junction biased in the forward direction has a temperature coefficient opposite to that of a breakdown junction. In this way, the device can be temperature compensated. This is a relatively expensive method since the characteristics of several pieces of silicon must be matched and then the pieces assembled in single package.

It is, therefore, an object of the present invention to provide a device having improved voltage limiting and voltage regulating characteristics.

It is another object of the present invention to provide a semiconductive device of the character described which is relatively immune to surface conditions, has low noise, and is temperature compensated.

It is another object of this invention to provide a voltage regulating semiconductive device having substantially zero dynamic impedance.

It is still another object of this invention to provide in one piece of silicon a voltage reference diode with a voltage reference value which can be selected over a wide range of voltage and having a low temperature coefficient of voltage.

It is a further object of this invention to provide a voltage reference device having voltages that can be made to operate over a wide range of selected voltages, having a low temperature coefficient of voltage and low dynamic resistance.

It is still a further object of this invention to provide a voltage regulating or voltage reference diode having substantially less noise than a diode having a single p–n junction.

It is still another object of this invention to provide a voltage reference or voltage regulating device less sensitive to surface conditions than a single junction avalanche diode.

A further object of this invention is to provide a voltage reference or voltage regulating device readily adapted to manufacture and assembly by simple processes.

These and other objects of the invention will become more clearly apparent from the following description when read in conjunction with the attached drawing.

Referring to the drawing:

FIGURE 1 schematically shows a three layer semiconductive device in accordance with the invention;

Figure 1:
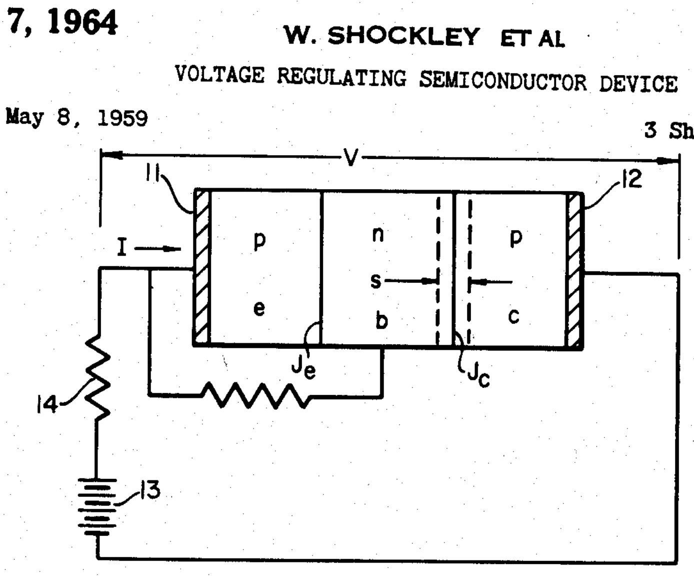

A device in accordance with the invention is schematically illustrated in FIGURE 1. The device illustrated comprises three contiguous layers *e* (emitter), *b* (base) and *c* (collector) forming two rectifying junctions $J_e$ (emitter junction) and $J_c$ (collector junction). The layers are shown as being p–n–p for purposes of exposition. However, it is apparent that opposite conductivity types (n–p–n) may also be employed. Ohmic contacts 11 and 12 are formed with the outer layers. The unregulated voltage, here illustrated as battery 13, is connected to the ohmic contacts with a limiting resistor 14 connected to limit the current through the device. A current I flows through the device as a result of the applied voltage. A regulated or limited voltage V is obtained at the ohmic contacts. The device is operated with the current flowing through the device many times greater than the thermally generated current which flows across the base-collector junction $J_c$ in the absence of injection across the emitter junction $J_e$. For silicon devices operating near room temperature, the current is generated largely in the space charge region of the collector junction designated by the letter *s*, FIGURE 1.

For the preferred mode of operation, the injected current arriving at the collector junction is many times larger than the thermally generated current. Accordingly, the total current is essentially the injected current arriving at the collector junction multiplied by avalanche multiplication in the space charge regions. The current flowing across the collector junction is then the avalanche multiplication factor $M(V_c)$ times the alpha ($\alpha$) of the emitter-base configuration for the structure, times the total current I flowing into the external terminal. Since the total current flowing across the collector junction must be equal to the total current I, it follows that alpha times the avalanche multiplication factor $M(V_c)$ must be almost exactly equal to unity.

In FIGURE 1, a resistance is connected between the emitter and the base terminals. This arrangement leads to an increase with increasing current of the fraction of the total current I that is injected. This consequence arises from the fact that the current across the emitter-base junction increases exponentially with voltage whereas the current flowing through the resistor increases only linearly in voltage. As a consequence of this, increasing voltage corresponding to increasing current leads to increased emitter efficiency. There are other means of producing emitter efficiencies which increase with increasing current. One of these is to use base layer material which has increasing lifetime due to increasing injected carrier density. Another is discussed in the article by Sah, Noyce and Shockley, referred to above, and are also discussed in detail for three and four layer diodes in co-pending application Ser. No. 786,818, filed January 14, 1959, now Patent No. 2,997,604.

Since alpha increases with increasing current, the voltage across the collector junction $J_c$ decreases with increasing current. This result comes about as follows: the current through the device increases, alpha increases, and consequently smaller multiplication at the collector junction is required to carry the total increased current. Therefore, the voltage across the collector junction $J_c$ tends to decrease with increasing current giving rise to negative resistance.

There are other voltage drops in the device, in particular, a voltage drop across the emitter junction $J_e$, and ohmic resistance drops in the emitter, collector and base layers. As will become apparent from the following description, it is possible to control the value of the negative resistance across the collector junction to such a degree that it cancels out the positive resistances at the emitter junction and in the body of the semiconductor at the contacts, etc. Under these conditions, no change in voltage occurs for small changes in current through the device. In other words, zero dynamic impedance can be obtained.

The multiplied current flowing through the base layer arriving at the collector junction may be made many times larger than the thermally generated current. Yet the multiplication by avalanche is not so near the breakdown condition as it is in a simple avalanche diode where there is no injected current.

Consequently, an individual electron reaching the collector junction will be multiplied by a much smaller factor. It is evident that this will reduce shot noise in the current flowing across the collector junction since shot noise for a given current is proportional to the size of the bursts of charge which carry the current. Furthermore, as discussed earlier, as breakdown is approached, current in many avalanche diodes is carried in small pulses of the order of a hundred micro-amperes. Since avalanche breakdown is not approached so closely in the device shown in FIGURE 1, noise of this type is suppressed.

The effect of surface recombination is such as to tend to cause the injected current to flow largely over the interior of the device rather than at the surface. Changes in surface conditions which result in variations of electric field near the surface have less effect than they do in conventional diodes. For a two layer regulating diode, the thermally generated reverse current tends to be generated largely at the surface. In the device of this invention injection into the base layer is occurring and the surface tends to act as a sink. The current reaching the collector junction flows in the interior of the device away from the surfaces.

A typical p-n junction having a breakdown of the order of 20 volts and an area of the order of 1 millimeter squared, has a thermally generated reverse current of the order of $10^{-8}$ amperes. In a device regulating in the range of 10 milliamperes, for example, the current is $10^6$ times larger than the thermally generated current. If the alpha of the structure is of the order of 0.001 or 0.0001, it is evident that the injected current reaching the collector junction will be 100 to 1000 fold larger than the thermally generated current; and for the same total current through the device, the multiplication factor may be 100 to 1000 fold less than in a single p-n junction diode. In the latter the multiplication factor for the same conditions must be $10^6$ or more giving rise to larger noise. Thus, it is evident that a substantial reduction in shot noise and other statistical noise at the collector junction can be achieved with alpha values as small as 0.0001.

A similar reduction in shot noise and the effect of current bursts can be accomplished by increasing the thermal generation in the space charge region so that smaller multiplication factors are required in the operating range. This can be accomplished by adding recombination-generation centers in the space charge region. This method, although in some ways simpler to carry out than the teachings of this invention, has two important disadvantages: thermal generation is very temperature sensitive and such a device can not be made to have zero dynamic impedance.

As the current through the device is initially increased from zero to the operating value, a maximum in voltage occurs. This maximum voltage occurs when the injection current arriving at the collector junction $J_c$ begins to dominate the thermally generated current. When this occurs, the increasing value of alpha requires a decreasing value of multiplication. If initially the alpha value is very small, then the voltage across the collector junction will approach very closely the value for infinite multiplication. This voltage is denoted by $V_B$ and is called the avalanche breakdown voltage. According to equations presented later, it is found that the limiting voltage as alpha approaches its maximum value, denoted by $\alpha_m$ is given approximately by $V_B(1-\alpha_m)^{1/n}$, where $n$ is a number in the neighborhood of three. If it is desired to keep the voltage maximum less than ten percent above the voltage for maximum alpha, it is evident that $\alpha_m$ should be no larger than 0.3.

In accordance with the invention zero temperature coefficients can be achieved. As previously discussed, increasing alpha means a decreasing voltage across the collector junction. Increasing temperature has an opposite effect upon the voltage. As is well known, the increase in the breakdown voltage $V_B$ with temperature corresponds to a temperature coefficient typically of the order of $10^{-3}/°$ C. for avalanche diodes. See, for example, International Rectifier Corporation News, December-January, 1958–1959, RN 1258, page 2, FIGURE 1, which shows that the temperature coefficient of breakdown voltage varies from zero at $V_B=5$ volts, to $7\times10^{-4}/°$ C. at 10 volts and to $10^{-3}/°$ C. at about 35 volts. If $\alpha_m$ remains constant, the voltage across the device would increase with increasing temperature. However, with increasing temperature, the diffusion length for majority carriers in silicon and germanium junctions tends to increase. Since the value of alpha is determined in large measure by the ratio of the width of the base layer to the diffusion length of minority carriers in the base layer, it follows that an increase in diffusion length results in an increase in alpha.

An analysis of the dependence of diffusion length upon temperature is discussed in an article entitled Temperature Dependence of Junction Transistor Parameters, Wolfgang W. Gärtner, Proc. I.R.E., vol. 45, page 662, May 1957. In this article it is stated that the diffusion length of minority carriers in silicon is found to have a temperature coefficient of about $7\times10^{-3}/°$ C. or about one order of magnitude larger than the temperature coefficient of breakdown. As subsequent analysis will show, it is possible to overcompensate the temperature effect of voltage across the collector junction by the temperature variation of alpha so as to obtain structures in which the voltage at a constant current decreases with increasing temperature. Quantitative principles are discussed below which make it possible to form devices having zero temperature coefficient of voltage for a given current.

In order to produce zero temperature coefficient, several other effects should be considered. One of these is the effect of temperature on the voltage across the emitter junction. For a given current, the voltage across the emitter junction is found to decrease with increasing temperature. As discussed below, this effect tends to be small and will in general lead to a temperature coefficient of the order of $3\times10^{-3}$ volts/° C. This may compensate the voltage drop across the collector junction for an avalanche diode with a breakdown voltage of the order of ten volts or less. For higher voltage breakdowns, however, it will not compensate, and it is necessary to introduce an effect due to the variation of alpha with temperature. This is essentially controlled by the thickness of the base layer. A detailed analysis will presently follow.

Devices can be designed empirically by diffusing emitter and collector layers from opposite sides into a slice of silicon. For example, a slice of silicon material of one conductivity type approximately 40 microns thick may be used. Diffused layers of opposite conductivity type extending inwards approximately 10–15 microns may then be formed. By varying the depth of diffusion, the thickness of the base region may be controlled. Without actual knowledge of the lifetime or diffusion length in the base region, it is possible to determine empirically the thickness which gives rise to zero temperature coefficient. If a device made in this way is operated at such a current that the negative resistance at the collector junction just balances out the remaining positive resistances, then a device having both zero temperature coefficient of voltage and zero current coefficient, or zero dynamic impedance, can be obtained. Such a device will also have small noise for the reasons discussed above and will be less sensitive to surface conditions than would an avalanche diode not having transistor action of injected carriers passing through the base layer.

Figure 2:
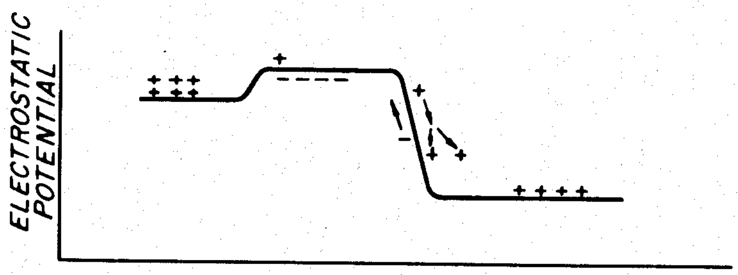
FIGURE 2 shows the electrostatic potential in the device shown in FIGURE 1.

FIGURE 2 shows the electrostatic potential in a three layer p-n-p structure in accordance with the invention. Injected holes (+) are represented as entering the base layer. A hole is shown falling down the potential drop at the collector junction and producing by secondary multiplication an additional hole (+) electron (−) pair. The operating conditions can be understood in terms of the multiplication of the injected current which reaches the collector junction and the current which would flow in the absence of injected current. Under steady state conditions, a current I entering the device at the left in FIGURE 1 must be carried across the collector junction by the sum of two terms: $I_s(V_c)$ which is the current which would flow in the absence of injection, plus the multiplied injected current $M(V_c)\alpha(I)I$. This steady state condition may be represented as follows:

$$I=I_s(V_c)+M(V_c)\alpha(I)I \qquad (1)$$

where $M(V_c)$ is the multiplication factor and $\alpha(I)I$ is the injected current arriving at the collector junction.

As current is increased first from very low values, the $\alpha(I)$ term is negligible and the total current through the device is essentially that which would be generated without injection. On the other hand, under operating conditions, the total current is much larger than that which would flow at the same voltage in the absence of injection.

$$I>>I_s \qquad (2)$$

When this condition prevails, Equation 1 may be rewritten in the form:

$$1>>I_s/I=1-M(V_c)\alpha(I) \qquad (3)$$

From this it follows that the product of the multiplication factor times alpha must be almost exactly equal to unity. Thus, in the operating range, the condition $$M(V_c)\alpha(I)=1 \qquad (4)$$

is very nearly satisfied.

Figure 3:
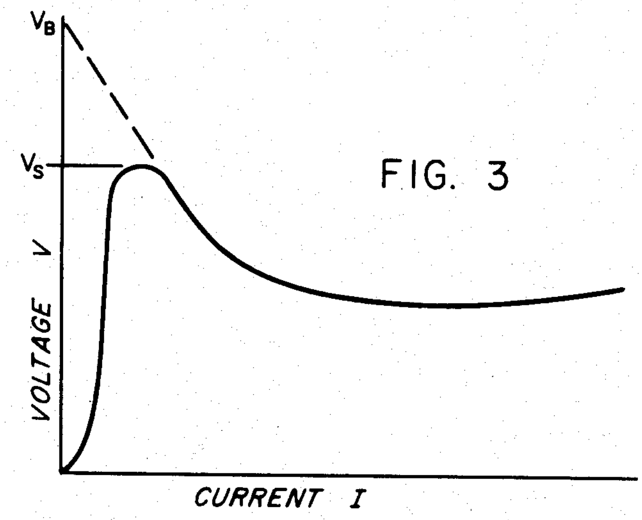
FIGURE 3 shows voltage-current characteristics of the device in accordance with the invention; the voltage maximum being accentuated for purposes of exposition.

As discussed earlier, the transfer of dominant current from being carried by the $I_s$ term to that carried by the multiplied injected current $M(V_c)\alpha(I)$ leads to a voltage maximum as represented in FIGURE 3. In actual devices this maximum may be almost imperceptible or even eliminated by other resistances. Devices with no maximum may have low but not vanishing dynamic resistances and will have low noise.

The resistance of the collector junction $J_c$ may be obtained by differentiating Equation 4 with respect to voltage and current. This gives $$\frac{dV_c}{dI}\frac{d\ln M}{dV_c}=-\frac{d\ln\alpha}{dI} \quad (5)$$

from which the dynamic resistance of the collector junction, $r_c$, is derived.

$$r_c=dV_c/dI=-(d\ln\alpha/dI)/(d\ln M/dV_c) \quad (6)$$

The multiplication factor $M(V_c)$ may be well approximated by $$M(V_c)=1/[1-(V_c/V_B)^n] \quad (7)$$

where $n$ varies with $V_B$, the uniformity of the junction and other factors; for $V_B=30$ volts, $n$ is approximately 3. This expression is discussed in various articles, see for example, S. L. Miller, "Ionization Rates for Holes and Electrons in Silicon," Physical Review, vol. 105, page 1246, 1957.

Substituting Equation 7 in Equation 6 gives $$\begin{aligned} r_c&=-(d\ln\alpha\, dI)V_c/(M-1)n \\ &=-(d\ln\alpha/dI)\alpha V_c/(1-\alpha)n \end{aligned} \quad (8)$$

where Equation 4 has been used to eliminate $M(V_c)$ from Equation 8.

Figure 4:
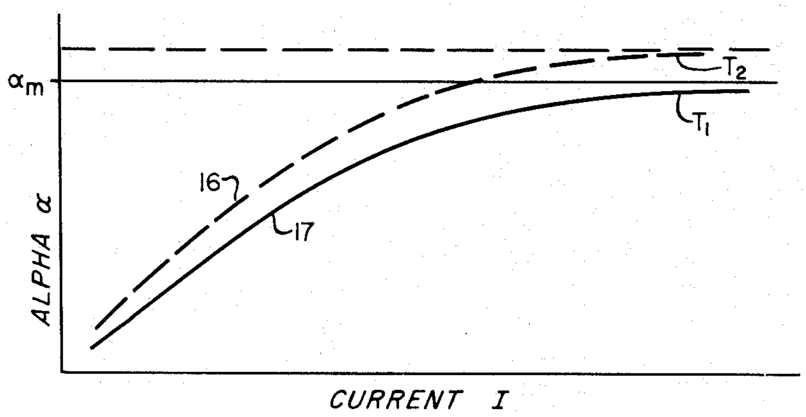
FIGURE 4 shows the variation of alpha with current.

As we shall discuss more fully below, alpha increases with increasing current in the manner shown in FIGURE 4. For small currents, alpha is substantially proportional to current and its logarithmic derivative is simply equal to $I^{-1}$. Consequently, $r_c$ is equal to $V_c$ times a constant for small values of alpha. This is the region represented by the dashed line in FIGURE 3. This corresponds to a constant negative resistance which extrapolated back to zero current and zero value of alpha leads to M equal to infinity or to $V=V_B$.

The theory of the variation of alpha with current for silicon transistor structures may be understood analytically in terms of the difference in the voltage dependence of the current which is injected into the base layer as compared to the current which recombines in the emitter junction. These currents are discussed in the article by Sah, Noyce and Shockley referred to above.

The injected current which flows into the base layer of a junction transistor is given by $$I_2=(qn_i^2D/n_nW^*)\exp(V_e/V\theta) \quad (9)$$

(See for example Moll and Ross, Transistor Technology, D. van Nostrand, 1958, vol. 2, page 392, and copending application Serial No. 786,818 above.)

Where $q$ is the charge on the electron, $n_i$ is the intrinsic density of carriers, D is the diffusion constant for minority carriers in the base layer, $n_n$ is the majority carrier density in the base layer, $V_e$ is the voltage across the emitter junction and $V\theta$ is equal to $kT/_q$ and is thermal voltage, and $W^*$ is the effective thickness of the base layer so far as diffusion into it is concerned. $W^*$, as given in Equation 15, is equal to the thickness of the base layer if it is uniform and thin compared to diffusion length, and is equal to the diffusion length for a uniform base layer which is thick compared to the diffusion length.

The current recombining in the space charge layer of the emitter junction is given by $$I_1=(qn_iW_R/\tau)\exp(V_e/2V\theta) \quad (10)$$

(See references for Equation 9.) In this equation, $W_R$ is the effective thickness of the space charge region for recombination and $\tau$ is an effective average lifetime in the emitter junction.

It will be understood that both the expressions for $I_1$ and $I_2$ are somewhat simplified and do not take into account refinements such as the difference in the effective cross-sections for holes and electrons. They suffice, however, to illustrate the general quantitative aspects of the design theory and can be used to furnish guidance in connection with empirical results.

If transmission through the base layer is regarded as being linear in injected currents over the level of interest, then the current reaching the edge of the space charge layer at the collector junction will be proportional to $I_2$ and the proportionality constant can be regarded as being the product of two factors beta ($\beta$) and gamma ($\gamma$). Gamma is the fraction of injected current which enters the base layer, the remainder of the injected current entering the emitter body. Beta is the fraction of the injected current entering the base layer which arrives at the collector junction. The product of these two factors is equal to $\alpha_m$, the maximum value which alpha approaches for large injected currents, in which case $I_2$ completely dominates $I_1$. $I_1$ is then negligible, and we may write for $I_2>>I_1$ $$\alpha(I)I=\beta\gamma I_2=\alpha_m I_2 \quad (11)$$

The transition from current predominantly recombining in the space charge region to current predominantly being injected is denoted by $I_\alpha$. It is the current which is equal to $I_1$ and $I_2$ when these two currents are equal to each other. From Equations 9 and 10 it follows that $$I_\alpha=I_1^2/I_2=qW_R^2n_nW^*/D\tau^2 \quad (12)$$

$W_R$ depends upon the concentration gradients of donors and acceptors at the emitter junction. It decreases as the junction becomes more abrupt. In some cases it may be desirable to reduce $I_\alpha$ and this can be accomplished by making the emitter junction more abrupt than the collector junction by diffusing the emitter junction for a shorter time than the collector junction.

$I_\alpha$ can also be decreased by decreasing $W^*$ and this can be accomplished by decreasing $\tau$ in the base layer. A larger reduction of $\tau$ in the base layer than in the emitter junction can be accomplished by diffusing a recombination center which is highly charged at a temperature at which the base layer is not intrinsic. For example, gold which can acquire a charge of $-3$ in germanium will tend to be strongly attracted to a non-intrinsic n-type base layer and will be much more concentrated there than in the emitter junction if diffusion takes place at a low enough temperature that a "built-in" potential hill still exists at the p-n junction. Similar but less pronounced results will hold for other cases. For example, gold in silicon can exist as either $+1$ or $-1$ charges and will tend to be concentrated in both the emitter and base layers.

For very small currents, $I_1$ is much larger than $I_2$, so that $I_1$ is practically equal to the total current I. From Equations 11 and 12, it is found that $\alpha(I)$ is directly proportional to I and is given by $$\alpha(I)\cong\alpha_m I/I_\alpha \quad (13)$$

For uniform base layer transistor structures, the transmission factor beta is given by $$\beta=1/\cosh(W/L_p) \quad (14)$$

where W is the thickness of the base layer and $L_p$ is the diffusion length $(D\tau)^{1/2}$ where D and $\tau$ are the diffusion constant and lifetime for injected carriers in the base layer. The current density entering the base layer can be found by differentiating the well known expressions for injected carrier density, which are not given here, and it is found that $W^*$ of Equation 9 is given by $$W^*=L_p\tanh(W/L_p) \quad (15)$$

The range of particular interest in designing improved voltage regulating and voltage reference diodes occurs in the range in which $I_2$ is greater than the transition current $I_a$:

$$I_2 > I_a \quad (16)$$

It follows that $I_2$ is much greater than $I_1$ so that $$I = I_1 + I_2 \doteq I_2 \quad (17)$$

For this approximation, the expression for alpha, Equation 11, reduces, according to Equation 12, to $$\begin{aligned} \alpha &= \alpha_m I_2/I = \alpha_m[1-(I_1/I)] \\ &= \alpha_m[1-(I_a/I)^{1/2}] \end{aligned} \quad (18)$$

This expression now enables one to evaluate the dynamic collector junction impedance given in Equation 8. The needed logarithmic derivative of alpha for the case in which I is much greater than $I_a$ is readily found to be $$\frac{d \ln \alpha}{dI} = I_a^{1/2}/2I^{3/2} \quad (19)$$

This expression can then be used in Equation 8 to obtain a value for $r_c$.

The main objective in selecting $r_c$ is to use it to cancel out other positive resistances so as to obtain zero dynamic impedance for the device as a whole. One of the important impedances is that of the emitter junction. In the range in which current is predominantly carried by the current $I_2$ it is found that the dynamic impedance for the emitter junction is given by $$dI/dV_e = I/V_\theta = 1/r_e \quad (20)$$

The total change in voltage across the device of FIGURE 1 is equal to the sum of the changes across the two junctions plus any ohmic drops. Thus $$\delta V = \delta(V_e + V_c + R_0 I) \quad (21)$$

where $R_0$ represents the sum of all ohmic contributions. The dynamic resistance is given by $$dV/dI \equiv r = r_e + r_c + R_0 \quad (22)$$

where $R_0$ is the ohmic resistance. The value of $R_0$ depends upon the structure of the device and in general can be made very small under the operating conditions of devices of this invention. Thus the important resistance to cancel out is the emitter dynamic resistance, $r_e$. From Equations 8, 19 and 20, it follows that the ratio of these resistances is $$r_c/r_e \doteq -[\alpha_m/2n(1-\alpha_m)](I_a/I)^{1/2} V_c/V_\theta \quad (23)$$

Thus it is desirable to have the value of I lead to a value of −1 for Equation 23 so that the dynamic resistance $r$ in Equation 22 is nearly equal to zero. Actually, a value slightly different from that which makes Equation 23 equal to zero should be selected so as to cancel the $R_0$ term.

It should be noted that Equation 23 is not extremely sensitive to temperature. $V_c$ varies only slightly with temperature and $V_\theta$ varies as the first power of temperature, the terms $I_a$ and $\alpha_m$ vary slowly with temperature. It is evident that some temperature compensation can be obtained by compensating the terms involving $\alpha_m$ and $I_a$ and $V_\theta$.

We shall next consider the means for obtaining zero temperature coefficient of voltage. First, we consider the voltage across the emitter junction at constant current. It is readily found by differentiating Equation 9 for the case of large currents where $I_2$ is practically equal to I and is given by $$\frac{dVe}{dT} \doteq V_\theta \frac{d}{dT} \ln W^*/n_i^2 D \quad (24)$$

The important term which depends upon temperature in the logarithm is that arising from the square of the intrinsic density. This quantity is given by $$n_i^2 = N_c N_v \exp(-E_g/kT) \quad (25)$$

where the symbol $N_c$ and $N_v$ have their customary meanings as defined, for example, in Shockley "Electrons and Holes and Semiconductors," D. van Nostrand, 1950, and the energy gap $E_g$ is the energy required to create a hole electron pair. The principal temperature variation of Equation 25 arises from the $E_g$ term which varies much more rapidly than $N_c$ and $N_v$ terms. The latter may be neglected in comparison. Equation 24 then reduces to $$\frac{dVe}{dT} \doteq -V_\theta E_g/kT^2 = -V_g/T \quad (26)$$

In the last line of Equation 26 the symbol $V_g$ has been introduced. This is the energy gap expressed in electron volts. For silicon, this is about 1.2 volts, so that at room temperature Equation 25 becomes approximately $4\times10^{-3}$ volts/°C.

For large currents such that Equation 18 leads to alpha approximately equal to $\alpha_m$ the value of the voltage across the collector junction is given in accordance with Equations 4 and 7 as $$V_c = V_B(1-\alpha_m)^{1/n} \quad (27)$$

The temperature coefficient of this voltage is readily found by differentiation to be $$\frac{d \ln V_c}{dT} \equiv V_{CT} = V_{BT} - \frac{1}{n}\frac{1}{1-\alpha_m}\frac{d\alpha_m}{dT} \quad (28)$$

In this equation, the symbol $V_{CT}$ is the temperature coefficient of voltage across the collector junction and the symbol $V_{BT}$ is the temperature coefficient of the breakdown voltage. As discussed earlier, this value is of the order of $10^{-3}$/° C. The value of $\alpha_m$ is according to Equations 11 and 14 approximately $$\begin{aligned} \alpha_m &= \gamma\beta = \gamma/\cosh(W/L_p) \\ &\doteq 2\gamma \exp(-W/L_p) \end{aligned} \quad (29)$$

where it is assumed that $\beta$ is small so that the hyperbolic term may be replaced by the exponential term. The important variation in Equation 29 arises from the increase in diffusion length with increased temperature. Thus, the derivative needed in Equation 28 may be written as follows:

$$\begin{aligned} \frac{d\alpha_m}{dT} &= \alpha_m(W/L_p)d \ln L_p/dT \\ &= \alpha_m \ln(2\gamma/\alpha_m)d \ln L_p/dT \\ &= \alpha_m \ln(2\gamma/\alpha_m)L_{pT} \end{aligned} \quad (30)$$

In this equation, the term in $L_{pT}$ is the temperature coefficient of diffusion length. From the article by Gärtner referred to above, it is found that the diffusion length in silicon increases by a factor of approximately seven for a temperature increase of about 250°. This leads to a temperature coefficient of about $8\times10^{-3}$/° C. The temperature coefficient $V_{BT}$ of $V_B$ has been discussed above. The results are summarized as follows:

$$V_{BT} = 5 \text{ to } 10\times10^{-4}/°\text{ C.} \quad (31)$$

$$L_{pT} = 8\times10^{-3}/°\text{ C.} \cong 10V_{BT} \quad (32)$$

For a 20 volt avalanche diode, for example, Equation 31 leads to a temperature coefficient of voltage of about $10^{-2}V$/° C. This is several times larger than the temperature derivative of voltage across the emitter junction given by Equation 26 which has the opposite sign. Thus some compensation results from Equation 26. However, in order to obtain a zero temperature coefficient voltage, it is necessary to obtain most of the compensation from the second term in Equation 28 which arises from the variation in alpha. To a first approximation the proper value for the term involving alpha is that which will make it cancel the temperature coefficient of the avalanche breakdown voltage. Actually, a somewhat smaller value, possible 25 percent smaller, will give a better result, because of the effect of the emitter voltage term in Equation 26. In order for the alpha term to cancel out the $V_{BT}$ and $V_g/T$ terms, we must have $$\frac{1}{n}\frac{\alpha_m \ln(2\gamma/\alpha_m)}{1-\alpha_m}=(1-V_g/V_B V_{BT} T)V_{BT}/L_{pT} \quad (33)$$

The right side of this equation is evidently approximately one-tenth. Since $n$ is approximately equal to 3, we find that if $$\alpha_m \cong 1/10 \quad (34)$$

and if $\gamma$ is approximately 1, then $$\ln(2\gamma/\alpha_m)=\ln 20 \doteq 3 \quad (35)$$

For this case, it is evident that a value of $\alpha_m$ of 0.1, i.e., somewhat less than $V_{BT}/L_{pT}$, will lead to approximate cancellation of the temperature coefficient in Equation 28.

Figures 7, 8:
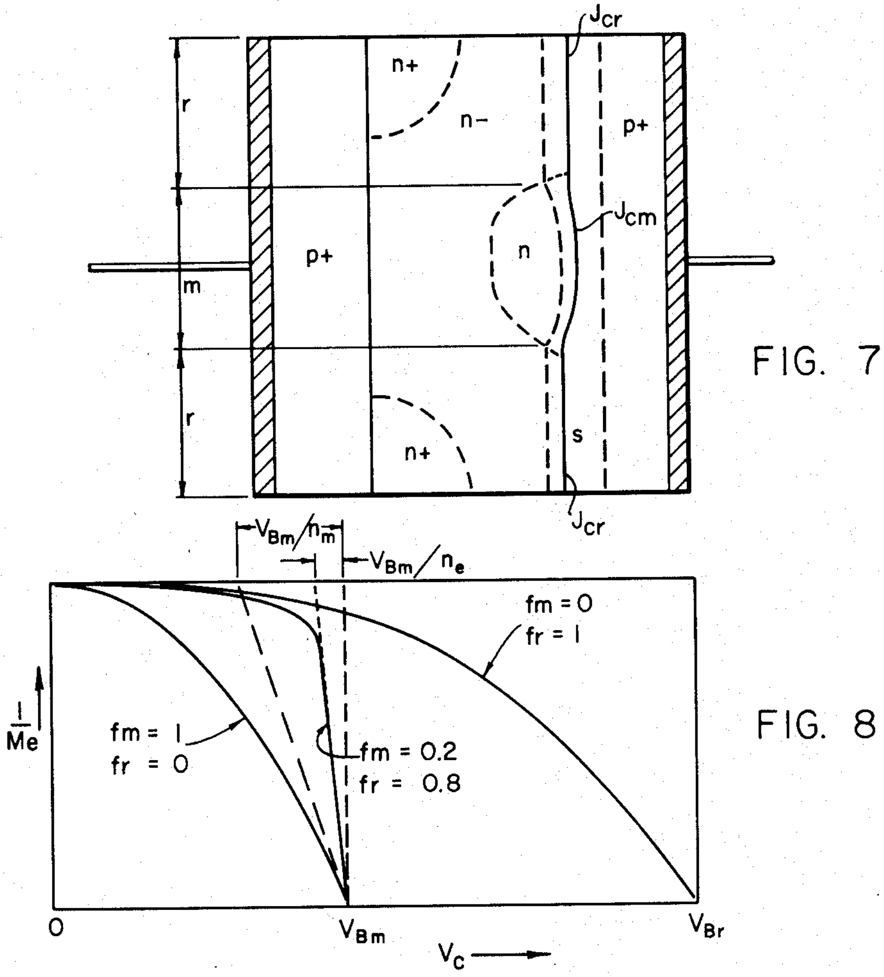
FIGURE 7 shows another semiconductive device incorporating the invention.
FIGURE 8 shows the reciprocal of the multiplication factor as a function of the voltage for the device shown in FIGURE 7.

FIGURE 7 shows a guard ring structure. Structures of this type have less surface sensitivity than devices of the type shown in FIGURE 1. This semiconductive device can be made to work on the principles previously discussed.

The device illustrated includes three layers p+, n−, and p+ forming two rectifying junctions. The center n− layer includes an interior region $n$ of higher impurity concentration whereby the collector junction has two regions $J_{cr}$ and $J_{cm}$. The middle or interior region is designated by the symbol $m$, and the rim region between the channel stopping $n+$ region and the interior $n$ region by the symbol $r$. The junction $J_{cr}$ which extends to the surface has a higher breakdown voltage than the interior junction $J_{cm}$. Guarding structures are described in copending application Serial No. 782,782, filed December 24, 1958, and now abandoned. The n− layer also includes channel stopping regions n+ on the surface. The action of channel stopping regions is described in copending application Serial No. 780,327, filed December 15, 1958, now Patent No. 3,099,591.

A theory similar to that of Equations 9 and 10 applies to this device. However, the current arriving at the collector junction consists of a fraction $f_m$ arriving at the middle region and a fraction $f_r$ in the rim region. These fractions are multiplied by avalanche multiplication factors $M_m(V_c)$ and $M_r(V_c)$. The equation corresponding to 4 then becomes $$\alpha(I)[f_m M_m(V_c)+f_r M_r(V_c)]=1 \quad (36)$$

since of the current $\alpha(I)I$ arriving at the space charge layer a fraction $f_m$ is multiplied by $M_m$ and a fraction $f_r$ by $M_r$, $$\text{where } f_r+f_m=1 \quad (37)$$

effective multiplication factor is $$M_e=f_m M_m+f_r M_r \quad (38)$$

and the current voltage relationship corresponds to $$\alpha(I)=1/M_e(V_c) \quad (39)$$

FIGURE 8 shows three curves for $1/M$ versus $V$, corresponding to a junction with $V_{Br}$ alone, $V_{Bm}$ alone and the composite structure with $f_r>f_m$. The expression of Equation 7 gives a curve in which the tangent at $1/M=0$ intersects $1/M=1$ at a voltage $V_B/n$ below $V_B$. It is seen that the composite curve, for which $M_e$ goes to infinity for $V=V_{Bm}$, is more abrupt and in effect corresponds to a higher effective value $n_e$ for $n$ than $n_m$. This means that to produce temperature compensation a larger value of $\alpha_m$ is required in Equation 33, and the same is true for low dynamic resistance in Equation 23.

It is thus evident that in addition to reducing surface effects, the structure of FIGURE 7 allows additional flexibility in design for achieving temperature compensation and resistance compensation.

It should be noted that although zero dynamic resistance may be obtained, zero dynamic impedance may not occur at higher frequencies. At high frequency the diffusion time effects through the base layer will cause alpha to have a frequency dependence. This effect may be made unimportant at a given frequency by decreasing base layer thickness. Furthermore, since $\alpha_m$ is small, lifetime in the base layer is small compared to diffusion time. This tends further to increase the frequency response of alpha.

For devices which are not perfectly temperature compensated, a dynamic resistance can arise from the heating effect of added current. If the temperature coefficient at voltage V and current I is $V_T \equiv d \ln V/dT$ and the temperature rise per watt of power P is $R_T \equiv dT/dW$, then an added current $dI$ will produce a temperature rise $$dT=R_T V dI \quad (40)$$

and this will produce an increase in voltage of $$dV=VV_T dT=V^2 R_T V_T dI \quad (41)$$

which corresponds to a contribution to dynamic resistance of $$R\text{ (due to heating)}=V^2 R_T V_T \quad (42)$$

For typical devices capable of dissipating the order of several watts of power, $R_T$ is of the order of 10° C./watt or more. $V_T$ for an uncompensated single junction device is about $10^{-3}$/° C. so that $R_T V_T$ is about $10^{-2}$/watt. For a 20 volt diode this gives an R value of 4 ohms. This example suffices to show the importance of "heat sinking" for uncompensated devices. For compensated devices, the effect of heating will be less important in proportion to the reduction of $dV/dT$.

In actual practice, the values quoted in the Gärtner article should be regarded as guides and values should be determined experimentally. The reasoning presented above shows how compensating effects may occur and indicates the degree of compensation that can be achieved. In the actual production of compensated devices, it is simpler to proceed empirically making a variety of devices using the theory presented in Equations 1 to 42 as a guide and then selecting a production process which leads to the desired degree of compensation.

Three layer devices in accordance with the invention were constructed and tested. The following examples are illustrative of the process of making devices in accordance with the invention. Test results are presented to show that the devices so constructed have low noise, have low dynamic impedance and are temperature compensated.

Devices having a limiting or regulating voltage of 16 volts at 10 ma. of current at room temperature were constructed as follows: A slice of silicon material having a thickness of 40–41 microns and a resistivity of .0403–.0426 ohm cm. had $P_2O_5$ predeposited thereon. The slice was at a temperature of 1050° C. and the $P_2O_5$ source at 215° C. Nitrogen was the carrier gas and flowed at a rate of approximately 200 cc./min. The slice was predeposited for thirty minutes. Subsequently, the slice was deposited in an oxygen atmosphere at 1300° C. for one hour. The oxide coating was washed off and ohmic contacts applied.

Figure 5:
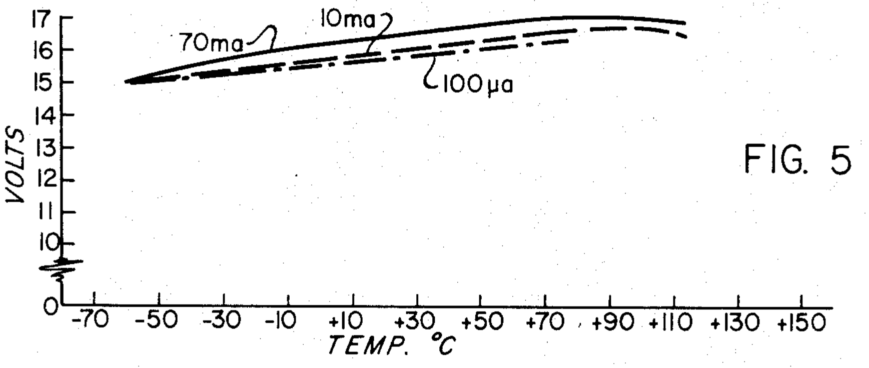
FIGURE 5 shows the limiting voltage as a function of temperature for various operating currents.
Figure 6:
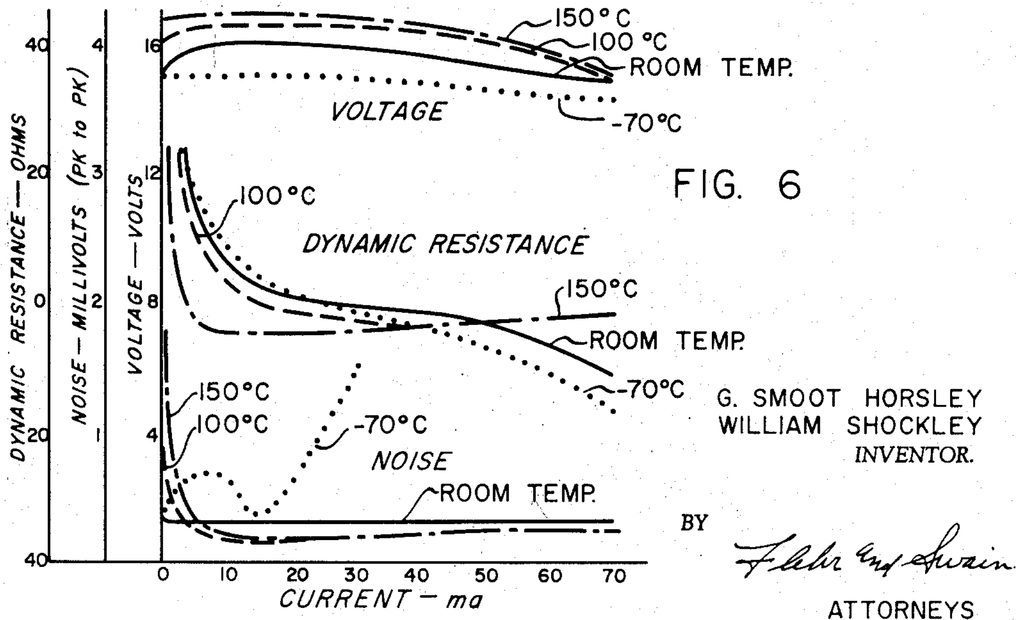
FIGURE 6 shows the dynamic resistance, noise, and limiting voltage as a function of current for various operating temperatures.

The device in accordance with the foregoing had a junction depth of 12.8 microns, giving a base layer of 14.4–15.4 microns. The device was tested and the curves presented in FIGURES 5 and 6 show the characteristics. It is seen from FIGURE 5 that the limiting or regulating voltage is relatively constant over a wide temperature range. In FIGURE 6 it is seen that the limiting or regulating voltage is also relatively constant with current. The noise at room temperature and above is very low while at −70° the noise is slightly greater. The dynamic resistance is relatively low over a considerable range of currents.

Devices having limiting or regulating voltages at 8.7–9.6 volts, 10 ma.; 11.5–12 volts, 10 ma.; 20 volts, 10 ma.;

and 25 volts, 10 ma. were also constructed. The following Table I gives the initial data:

*Table I*

| | | | | |
|---|---|---|---|---|
| Regulating voltage, volts | 8.7–9.6 | 11.5–12.0 | 20 | 25 |
| Starting Resistivity, ohm cm | .0194–.0204 | .0403–.0426 | .122–.133 | .120–.124 |
| Slice Thickness, microns | 40–41 | 40–41 | 40–41 | 40–42 |
| Predeposition Temp., °C | 801 | 1050 | 1050 | 881 |
| $P_2O_5$ Source Temp., °C | 214 | 214 | 214 | 213 |
| Predeposition time, min | ---------- | 30 | 30 | 30 |
| Diffusion Temp., °C | 1,300 | 1,300 | 1,300 | 1,300 |
| Diffusion Time, min | 10 | 10 | 11 | 60 |
| Base Thickness, microns | 31–32 | 26–29 | 27–28 | 13–14 |
| Current, ma | 10 | 10 | 10 | 10 |

Figure 9:
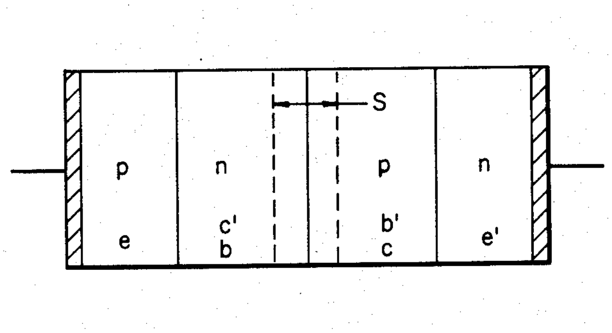
FIGURE 9 shows a four layer device incorporating the invention.

In FIGURE 9 there is illustrated a device having four contiguous layers forming three junctions. The center junction can be regarded as the collector junction of the devices designated *e*, *b*, *c* and *e'*, *b'*, *c'* while the outer junctions are the emitter junctions. The center layers serve as the base of one device and the collector of the other. By suitably choosing the impurity concentration, junction depth, etc., the characteristics of the device can be controlled. In the structure illustrated, there is more flexibility in controlling noise and temperature compensation since there are two alphas available. By choosing the alphas at different values the range of temperatures and currents can be extended over those described above with respect to the three layer device.

It is evident that the theory presented here can be extended to the case of germanium devices in which case the larger values of $n_i$ lead to relatively less importance of $I_1$ compared to $I_2$. In this case, it may be desirable to introduce an additional resistive path either externally or as a resistive layer connecting the emitter and the base layers to play the role of the resistor shown in FIGURE 1. The theory can be extended in such cases in a straightforward manner.

We claim:

1. A voltage regulating semiconductive device for regulating a voltage applied thereto including at least emitter, base and collector layers forming emitter and collector junctions, connections to at least the outer layers for receiving the voltage to be regulated, means for producing a component of current flow directly from the emitter layer to the base layer, said means being less responsive to voltage than is current injected from emitter to base, said layers being so selected that the emitter to base alpha lies between 0.0001 and 0.3 and means for obtaining a regulated voltage across said first and second ohmic contacts.

2. A voltage regulating device for regulating a voltage applied thereto including at least emitter, base and collector layers forming emitter and collector junctions, connections to at least the outer layers for receiving the voltage and applying it across the device, and means for producing a component of current flow directly from the emitter layer to the base layer, said means being less responsive to voltage than is current injected from the emitter layer to the base layer, said device further having an emitter to base alpha which does not exceed the ratio of the temperature coefficient of breakdown voltage at the collector junction to the temperature coefficient of diffusion length for minority carriers in the base layer and means for obtaining a regulated voltage across said first and second ohmic contacts.

3. A semiconductive voltage regulating device for regulating a voltage applied thereto comprising a layered structure including at least emitter, base and collector layers forming emitter and collector junctions, terminals adapted to receive the voltage to be regulated connected to at least the outer layers, said structure having an emitter to base layer alpha value which lies in the range of 0.0001 to 0.3 and means for obtaining a regulated voltage across said terminals.

4. A semiconductive voltage regulating device comprising a plurality of layers in a semiconductive material, adjacent layers being of opposite conductivity type, said layers forming at least emitter and collector junctions, said emitter junction including means for producing an emitter efficiency which increases with increasing current to thereby give a negative resistance, ohmic contacts formed with the outer layers, means for applying a voltage to be regulated across said device in such a direction as to reverse bias the collector junction, means connected in circuit with said device for limiting the current through said device as a result of the unregulated voltage so that it is of such magnitude that the negative resistance due to increased efficiency substantially cancels the positive resistances in the device whereby the device has negligible dynamic impedance over a limited range of current, said device having an emitter to base layer alpha in the range of 0.0001 to 0.3 and means for obtaining a regulated voltage across said terminals.

5. A semiconductive voltage regulating device comprising a plurality of layers in a semiconductive material, adjacent layers being of opposite conductivity type, said layers forming at least emitter and collector junctions, said emitter junction including means for producing an emitter efficiency which increases with increasing current to thereby give a negative resistance, ohmic contacts formed with the outer layers, means for applying a voltage to be regulated across said device in such a direction as to reverse bias the collector junction, means connected in circuit with said device for limiting the current through said device as a result of the unregulated voltage so that it is of such magnitude that the negative resistance due to increased efficiency substantially cancels the positive resistances in the device whereby the device has negligible dynamic impedance over a limited range of current, said device having an emitter to base layer alpha which does not exceed the ratio of the temperature coefficient of breakdown voltage for the collector junction to the temperature coefficient of diffusion length for minority carriers in the layer between the emitter and collector junctions and means for obtaining a regulated voltage across said terminals.

6. A voltage regulating semiconductive device for regulating a voltage applied thereto including at least emitter, base and collector layers forming emitter and collector junctions, connections to at least the outer layers for receiving a voltage to be regulated, means for producing a component of current flow directly from the emitter layer to the base layer, said means being less responsive to voltage than is current injected from emitter to base, the impurity concentration and thickness of said layers being selected so that the emitter to base alpha lies between 0.0001 and 0.3, and means connected in circuit with said device for limiting the current through said device so that it is of such magnitude that the negative resistance due to increased efficiency of the device substantially cancels the positive resistances in the device whereby the device has negligible dynamic impedance over a limited range of current and means for obtaining a regulated voltage across said terminals.

7. A semiconductive voltage regulating device comprising a plurality of layers of semiconductor material, adjacent layers being of opposite conductivity type, said layers forming at least emitter and collector junctions, said emitter junction including means for producing an emitter efficiency which increases with increasing current to thereby give negative resistance, at least one of said layers having an inner region and an outer surrounding region having different impurity concentration whereby the device has an interior region having first characteristics and an exterior region having second characteristics, ohmic contacts formed to the outer layers, means for applying a voltage to be regulated to said contacts, means connected in circuit with said device for limiting the current through the device as a result of the unregulated voltage so that it is of such magnitude that the negative resistance due to increased efficiency substantially cancels the positive resistance in the device whereby the device has negligible dynamic impedance over a limited range and means for obtaining a regulated voltage across said terminals.

8. A semiconductive voltage regulating device comprising emitter, base and collector layers forming emitter and collector junctions, said base layers having an outer region of low impurity concentration and an interior region adjacent the collector junction having a higher impurity concentration, said device having an emitter to base alpha which does not exceed the ratio of the temperature coefficient of breakdown voltage for the collector junction to the temperature coefficient of diffusion length for minority carriers in the base layer and means for obtaining a regulated voltage across said terminals.

References Cited in the file of this patent

UNITED STATES PATENTS

| | | |
|---|---|---|
| 2,614,140 | Kreer | Oct. 14, 1952 |
| 2,655,610 | Ebers | Oct. 13, 1953 |
| 2,779,877 | Lehovec | Jan. 29, 1957 |
| 2,831,984 | Ebers et al. | Apr. 22, 1958 |
| 2,874,312 | Radcliffe | Feb. 17, 1959 |
| 2,936,431 | Guenther | May 10, 1960 |
| 2,962,605 | Grosvalet | Nov. 29, 1960 |
| 3,004,209 | Knudsen | Oct. 10, 1961 |